(12) United States Patent
Asaduzzaman et al.

(10) Patent No.: US 7,149,914 B1
(45) Date of Patent: Dec. 12, 2006

(54) CLOCK DATA RECOVERY CIRCUITRY AND PHASE LOCKED LOOP CIRCUITRY WITH DYNAMICALLY ADJUSTABLE BANDWIDTHS

(75) Inventors: Kazi Asaduzzaman, Milpitas, CA (US); Wilson Wong, San Francisco, CA (US); Sergey Shumarayev, San Leandro, CA (US)

(73) Assignee: Altera Corporation, San Jose, CA (US)

( * ) Notice: Subject to any disclaimer, the term of this patent is extended or adjusted under 35 U.S.C. 154(b) by 336 days.

(21) Appl. No.: 10/672,901

(22) Filed: Sep. 26, 2003

(51) Int. Cl.
*G06F 1/04* (2006.01)
*G06F 1/06* (2006.01)
*G06F 1/08* (2006.01)
*G06F 1/24* (2006.01)

(52) U.S. Cl. ............... 713/500; 713/501; 713/503
(58) Field of Classification Search ........... 713/500, 713/501, 503
See application file for complete search history.

(56) References Cited

U.S. PATENT DOCUMENTS

| 5,631,587 | A * | 5/1997 | Co et al. ............ 327/107 |
| 6,483,886 | B1 | 11/2002 | Sung et al. ............ 375/376 |
| 6,621,356 | B1 * | 9/2003 | Gotz et al. ............ 331/25 |
| 6,636,979 | B1 * | 10/2003 | Reddy et al. ............ 713/503 |
| 6,650,140 | B1 | 11/2003 | Lee et al. ............ 326/39 |
| 6,650,195 | B1 * | 11/2003 | Brunn et al. ............ 331/177 V |
| 6,803,827 | B1 * | 10/2004 | Kenney et al. ............ 331/16 |
| 6,859,108 | B1 * | 2/2005 | Abbasi et al. ............ 331/17 |
| 6,911,868 | B1 * | 6/2005 | Kumar DVJ ............ 331/16 |
| 7,034,622 | B1 * | 4/2006 | Yamane et al. ............ 331/25 |
| 2001/0033188 | A1 | 10/2001 | Aung et al. ............ 327/141 |
| 2002/0025015 | A1 * | 2/2002 | Notani ............ 375/376 |
| 2003/0052709 | A1 | 3/2003 | Venkata et al. ............ 326/37 |
| 2003/0067356 | A1 * | 4/2003 | Bokui et al. ............ 331/11 |
| 2004/0248532 | A1 * | 12/2004 | Khoini-Poorfard ............ 455/132 |

OTHER PUBLICATIONS

U.S. Appl. No. 10/059,014, filed Jan. 29, 2002, Lee et al.
U.S. Appl. No. 10/273,899, filed Oct. 16, 2002, Venkata et al.
U.S. Appl. No. 10/317,262, filed Dec. 10, 2002, Venkata et al.
U.S. Appl. No. 10/454,626, filed Jun. 3, 2003, Lui et al.
U.S. Appl. No. 10/349,541, filed Jan. 21, 2003, Venkata et al.
U.S. Appl. No. 10/637,982, filed Aug. 8, 2003, Venkata et al.
U.S. Appl. No. 10/668,900, filed Sep. 22, 2003, Asaduzzaman et al.

* cited by examiner

*Primary Examiner*—Lynne H. Browne
*Assistant Examiner*—Michael J. Brown
(74) *Attorney, Agent, or Firm*—Fish & Neave IP Group Ropes & Gray LLP; Gall C. Gotfried

(57) ABSTRACT

Clock data recovery (CDR) circuitry or phase locked loop (PLL) circuitry can be provided with a dynamically adjustable bandwidth. One CDR circuit or PLL circuit can be provided to support multiple systems or protocols, multiple parameter requirements for a given system or protocol, and changes in the input frequency or data rate within a given system or protocol. The parameters can include jitter (e.g., jitter tolerance, jitter transfer, jitter generation), source of dominant noise, and lock time. Control signals can be used to dynamically adjust the bandwidth of the CDR circuitry or PLL circuitry while the circuitry is processing data. The control signals can be set by a PLD, by a processor, by circuitry external to the PLD, or by user input.

43 Claims, 6 Drawing Sheets

CLOCK DATA RECOVERY CIRCUITRY AND PHASE LOCKED LOOP CIRCUITRY WITH DYNAMICALLY ADJUSTABLE BANDWIDTHS

BACKGROUND OF THE INVENTION

This invention relates to clock data recovery circuitry and phase locked loop circuitry. More particularly, this invention relates to providing clock data recovery circuitry and phase locked loop circuitry with dynamically adjustable bandwidths.

An increasingly important type of signaling between devices is signaling in which the clock signal information is embedded in a serial data stream so that no separate clock signal needs to be transmitted. For example, data may be transmitted serially in "packets" of several successive serial data words preceded by a serial "header" that includes several training bits having a predetermined pattern of binary ones and zeros. The clock signal information is embedded in the data signal by the high-to-low and/or low-to-high transitions in that signal, which must have at least one high-to-low or low-to-high transition within a certain number of clock signal cycles. At the receiver the clock signal is "recovered" from the data signal. The clock signal is then used to recover the data from the data signal. For convenience herein this general type of signaling will be referred to generically as "clock data recovery" or "CDR" signaling.

CDR signaling is now being used in many different signaling protocols. These protocols vary with respect to such parameters as clock signal frequency, header configuration, packet size, data word length, number of parallel channels, etc. Such signaling protocols include (1) industry-standard forms such as XAUI, InfiniBand (IB), Fibre Channel (FC), Gigabit Ethernet, Packet Over SONET or POS-5, Serial RapidIO, etc., and (2) any of a wide range of non-industry-standard or "custom" forms that particular users devise for their own uses. Such custom protocols often have at least some features similar to industry-standard protocols, but deviate from industry standards in other respects.

A programmable logic device ("PLD") is a general-purpose integrated circuit device that is programmable to perform any of a wide range of logic tasks. Rather than having to design and build separate logic circuits for performing different logic tasks, general-purpose PLDs can be programmed in various different ways to perform those various logic tasks. Many manufacturers of electronic circuitry and systems find PLDs to be an advantageous way to provide various components of what they need to produce.

CDR signaling is an area in which it would be highly desirable to have the ability to use PLDs to avoid having to always design and build CDR transmitters and receivers that are specific to each of the many different CDR protocols.

In addition to CDR signaling, phase-locked loop (PLL) circuitry is another area in which it would be highly desirable to have the ability to use PLDs to avoid having to always design and build PLL circuits that are specific to each of the many different protocols. PLL circuitry can be part of CDR circuitry or can be separate from CDR circuitry (e.g., on PLDs that do not have CDR circuitry).

In conventional CDR circuitry and PLL circuitry, each circuit is programmed to have a fixed loop bandwidth that is based on the specific requirements for a given system or protocol. The bandwidth indicates the performance of the CDR circuitry or PLL circuitry. More particularly, the bandwidth indicates how quickly and efficiently the CDR circuitry or PLL circuitry performs in, for example, receiving and processing data, adjusting to changes in the input frequency, recovering data at the output, and filtering out noise from different sources.

Different systems or protocols have different bandwidths requirements. Programmability of a PLD provides for one CDR circuit or PLL circuit that can support different systems or protocols with different bandwidth requirements. Each system or protocol that uses CDR circuitry or PLL circuitry has specific requirements for a variety of parameters. For example, in a synchronous communications system, the CDR circuitry or PLL circuit must meet specific requirements for jitter tolerance, jitter transfer, and jitter generation. Jitter tolerance refers to a maximum amount by which the input data signal is allowed to deviate from its ideal position due to noise while still generating a correct output data signal. To meet jitter tolerance requirements at the receiver, different systems or protocols impose different minimum bandwidth requirements for the CDR circuitry or PLL circuitry. Jitter transfer refers to the ratio of the output noise to the input noise. To meet jitter transfer requirements, different systems or protocols impose different bandwidth requirements for the CDR circuitry or PLL circuitry in order to achieve as small a noise ratio as possible. The smaller the noise ratio, the better the performance of the CDR circuitry or PLL circuitry. Jitter generation refers to the amount of noise generated at the output of the transmitter and receiver. To meet jitter generation requirements, different systems or protocols impose different maximum bandwidth requirements for the CDR circuitry or PLL circuitry. Programmability of the bandwidth allows the different parameters to be changed to meet the specific requirements for a given system or protocol. Programmability of the bandwidth also allows the bandwidth to be changed based upon changes in the input frequency or data rate within a given system or protocol. Programmability of the bandwidth further allows the bandwidth to be changed based upon the dominant source of noise. Upon determining whether noise from the input or the power supply is more dominant, the bandwidth can be programmed accordingly in order to filter the more dominant noise.

The bandwidth of the CDR circuitry or PLL circuitry can be programmed by the PLD using configuration random access memory (CRAM) control bits. In response to processing data in a new system or protocol, the PLD often needs to be reconfigured in order to reprogram the CDR circuitry or PLL circuitry with a new bandwidth. In view of the foregoing, it would further be desirable to provide CDR circuitry or PLL circuitry with a dynamically adjustable bandwidth.

SUMMARY OF THE INVENTION

In accordance with this invention, clock data recovery (CDR) circuitry and phase locked loop (PLL) circuitry are provided with dynamically adjustable bandwidths. The invention is described herein primarily in the context of clock data recovery (CDR) circuitry for clarity, although the invention can also be applied to phase locked loop (PLL) circuitry both as part of the CDR circuitry or separate from the CDR circuitry. The CDR circuitry or PLL circuitry of this invention is preferably programmable in at least some respects and may either be included on an integrated circuit with other more traditional PLD circuitry, or it may be at least partly included on a separate integrated circuit. If the CDR circuitry or PLL circuitry is at least partly on a separate circuit, it may be configured to facilitate efficient coupling to a more traditional PLD integrated circuit (e.g., in a common package with the PLD).

The CDR circuitry or PLL circuitry can be designed to have a dynamically adjustable bandwidth that does not require the circuitry to be reconfigured in order to reprogram the circuitry with a new bandwidth setting. One CDR circuit or PLL circuit can be provided to support multiple systems or protocols, multiple parameter requirements for a given system or protocol, and changes in the input frequency or data rate within a given system or protocol. Providing CDR circuitry or PLL circuitry with a dynamically adjustable bandwidth allows for the flexibility to change the bandwidth while the circuitry is processing data based on changes in the system or protocol requirements, changes in the input frequency or data rate within a given system or protocol, the source of dominant noise in the circuitry, the desired speed with which the circuitry can track variations in input frequency, the desired speed with which the circuitry can acquire frequency or phase lock of data in the circuitry, or any other suitable basis or at any suitable time. A user can customize the CDR circuitry or PLL circuitry with programmable logic that determines how the circuitry is to monitor and dynamically control the bandwidth.

The settings of different components in the CDR circuitry or PLL circuitry determine the bandwidth of the circuitry. The bandwidth can be determined by the following: the current in a charge pump, the resistance and capacitance of a loop filter, the voltage gain from a voltage controlled oscillator (VCO), the scale factor of a divider in the feedback loop, and any other suitable setting or component. The bandwidth is directly proportional to the settings of the charge pump, loop filter, and VCO, and inversely proportional to the setting of the divider. For example, the larger (or smaller) the current, the resistance, capacitance, or the voltage gain, the larger (or smaller) the bandwidth of the circuitry. The larger (or smaller) the scale factor, the smaller (or larger) the bandwidth of the circuitry. The bandwidth can be made dynamically adjustable by allowing one or more settings in one or more of the different components in the CDR or PLL circuitry to be changed in response to the specific requirements for a given system or protocol, or in response to changes in the input frequency or data rate within a given system or protocol. The specific requirements can be for parameters such as, for example, jitter (e.g., jitter tolerance, jitter transfer, jitter generation), source of dominant noise, lock time, or other suitable parameter or combination of parameters. Control signals can be used to dynamically adjust the bandwidth of the CDR circuitry or PLL circuitry. The control signals can be set by a PLD, by a processor, by circuitry external to the PLD, by user input, or a combination of the same.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION

Figure 1:
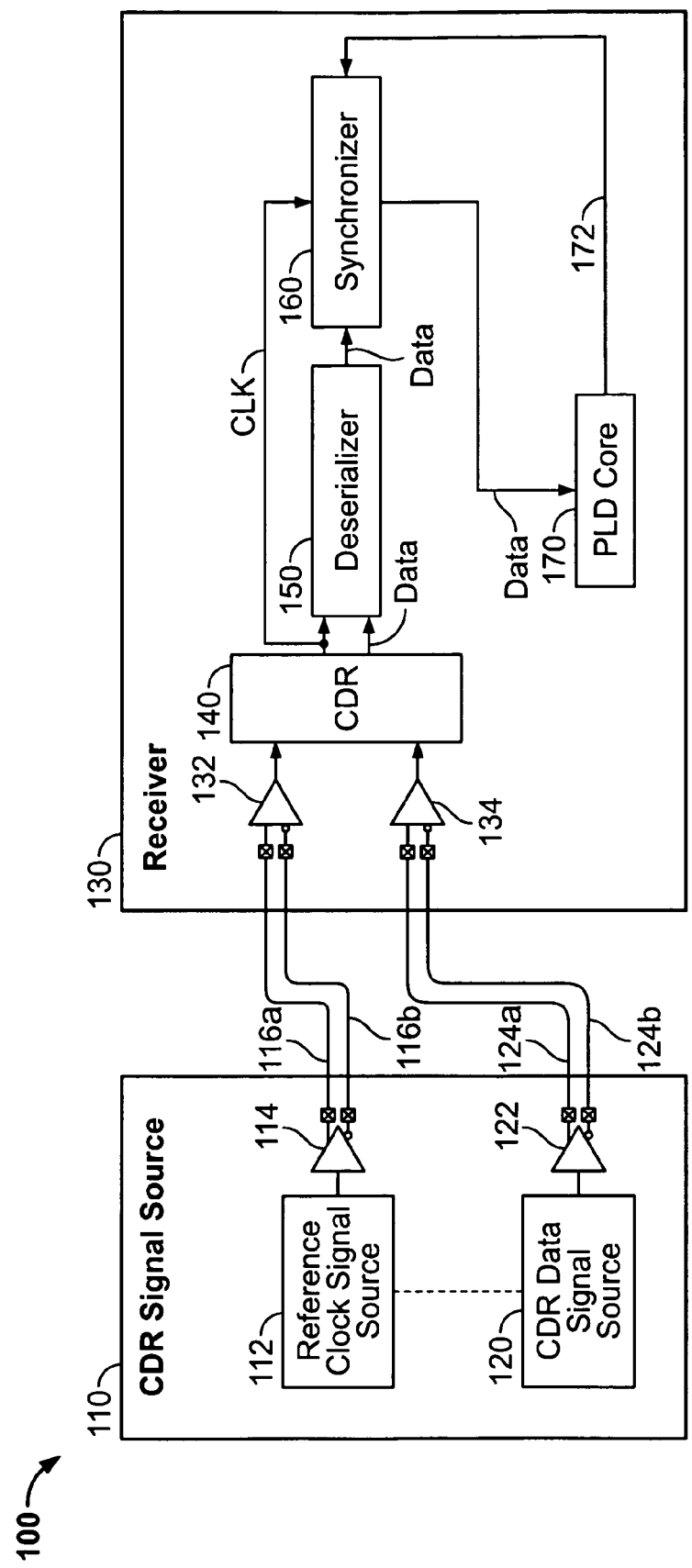
FIG. 1 is a simplified schematic block diagram of an illustrative embodiment of clock data recovery (CDR) signaling apparatus in accordance with the invention.

The invention is described herein primarily in the context of clock data recovery (CDR) circuitry for clarity, although the invention can also be applied to phase locked loop (PLL) circuitry both as part of the CDR circuitry or separate from the CDR circuitry. The PLL circuitry can be used alongside CDR circuitry on a programmable logic device (PLD) or on a PLD that does not have CDR circuitry, FIG. 1 shows an illustrative embodiment of CDR signaling apparatus 100 in accordance with the invention. This apparatus includes a CDR signal source 110 and a receiver 130. Although elements 110 and 130 could be on the same integrated circuit, that is generally not the case and they are more typically portions of separate integrated circuits or circuit assemblies. For example, in systems like those shown in FIG. 5, receiver 130 could be part of element 510/520, while source 110 could be part of any other element(s) 530, 540, 550, and/or 560.

CDR signal source 110 includes a reference clock signal source 112 and a CDR data signal source 120, which can be conventional or substantially conventional. Reference clock signal source 112 produces a reference clock signal having a frequency relationship to the clock frequency embedded in the CDR data signal produced by CDR data signal source 120. For example, reference clock signal source 112 can produce a reference clock signal having the same frequency as the clock frequency embedded in the CDR data signal or any convenient fraction or multiple of the embedded clock frequency. In particular, the reference clock signal frequency REFCLK is related to the embedded clock frequency EMBCLK by the following relationship:

$$REFCLK*W=EMBCLK,$$

where W is a convenient scale factor such as 0.5, 1, 2, 4, etc. There is typically a frequency threshold requirement between the output signals of elements 112 and 120: the reference clock signal (e.g., REFCLK or REFCLK*W) and the CDR data signal. For example, for a given signaling protocol, the reference clock signal may need to be within 100 PPM of the CDR data signal. Different signaling protocols may have different frequency thresholds. There does not, however, need to be any particular phase relationship between the output signals of elements 112 and 120.

The output signal of reference clock signal source 112 is applied to a conventional differential signaling driver 114 to produce a pair of differential REFCLK output signals on leads 116a and 116b. (This is optional. The reference clock signal can instead be transmitted between elements 110 and 130 as a single signal on a single lead if desired.)

As has been mentioned, CDR data signal source 120 can be a conventional source of a CDR data signal. That signal is applied to a conventional differential signaling driver 122 to produce a pair of differential CDR data output signals on leads 124a and 124b. (Once again, differential signaling for the CDR data signal is optional, and the CDR data signal can instead be transmitted between elements 110 and 130 via a single lead.)

At receiver 130 the differential REFCLK signals on leads 116a and 116b are applied to a conventional differential driver 132 in order to convert the received REFCLK signals back to a signal on a single lead for application to CDR circuitry 140. Similarly, the differential CDR data signals on leads 124a and 124b are applied to a conventional differential driver 134 in order to convert the received CDR data signals back to a signal on a single lead for application to CDR circuitry 140.

CDR circuitry 140 uses the received REFCLK signal and CDR data signal to recover a clock signal embedded in the CDR data signal which is then used to recover a data signal from the CDR data signal. The signals are applied to deserializer 150, which converts the applied serial data to parallel data. The parallel data signals are applied to synchronizer 160 in synchronism with the clock signal produced by CDR circuitry 140. Synchronizer 160 buffers the parallel data for ultimate application to PLD core 170 in synchronism with another clock signal 172 supplied to synchronizer 160 by PLD core 170.

In accordance with the invention, the CDR circuitry (e.g., circuitry 140 in receiver 130) can operate between two modes of operation: reference clock mode and data mode. The CDR circuitry can automatically switch between these two modes of operation in response to predetermined conditions. Alternatively, the CDR circuitry can switch between these two modes of operation using control signals set by a PLD, by a processor, by circuitry external to the PLD, by user input, or a combination of the same.

During reference clock mode, the CDR circuitry uses the reference clock signal for a given protocol to produce a recovered clock that is similar in phase and frequency to the phase and frequency of the reference clock signal. During data mode, the CDR circuitry adjusts the phase of the recovered clock to align to the CDR data signal. The phase-adjusted recovered clock is used to recover the clock signal embedded in the CDR data signal, which is then used to recover the data from the CDR data signal.

The CDR circuitry typically includes a parts per million (PPM) detector, also known as a frequency detector, which can be used to indicate when the CDR circuitry has completed processing in reference clock mode. The PPM detector computes a frequency difference between the reference clock frequency and the clock frequency produced by the CDR circuitry, and compares the frequency difference to a PPM setting (e.g., 100 PPM, 200 PPM). The frequency difference, in PPM, can be computed by (1) taking the difference between the reference clock frequency (RCF) and the clock frequency produced by the CDR circuitry (CF), (2) dividing the difference by the reference clock frequency, and (3) dividing the result by one million as shown in the following equation:

$$\frac{(RCF-CF)/RCF}{1,000,000}$$

If the frequency difference is at or less than the PPM setting, the PPM detector outputs a signal (e.g., sets the output to logic 1). The signal indicates when the clock signal produced by the CDR circuitry has a frequency similar to the frequency of the reference clock signal. When the PPM detector outputs this signal, the CDR circuitry can switch from reference clock mode to data mode. If a problem is detected during data mode (e.g., the recovered clock is no longer aligned to the CDR data signal), the CDR circuitry can switch back to reference clock mode so that the CDR circuitry can become retrained to the reference clock mode.

Figure 2A:
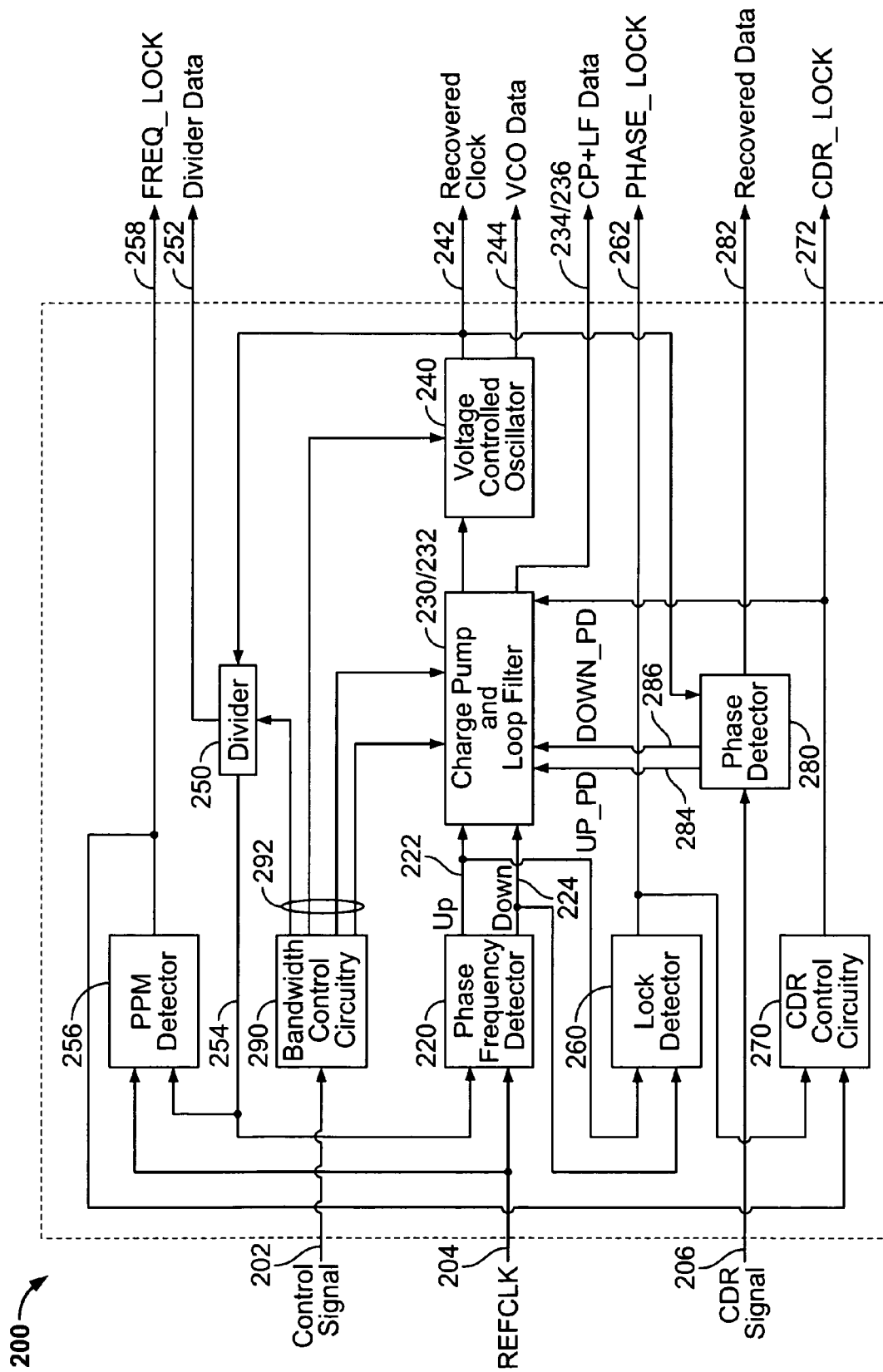
FIGS. 2A–B are simplified block diagrams of illustrative embodiments of CDR circuitry in accordance with the invention.
Figure 2B:
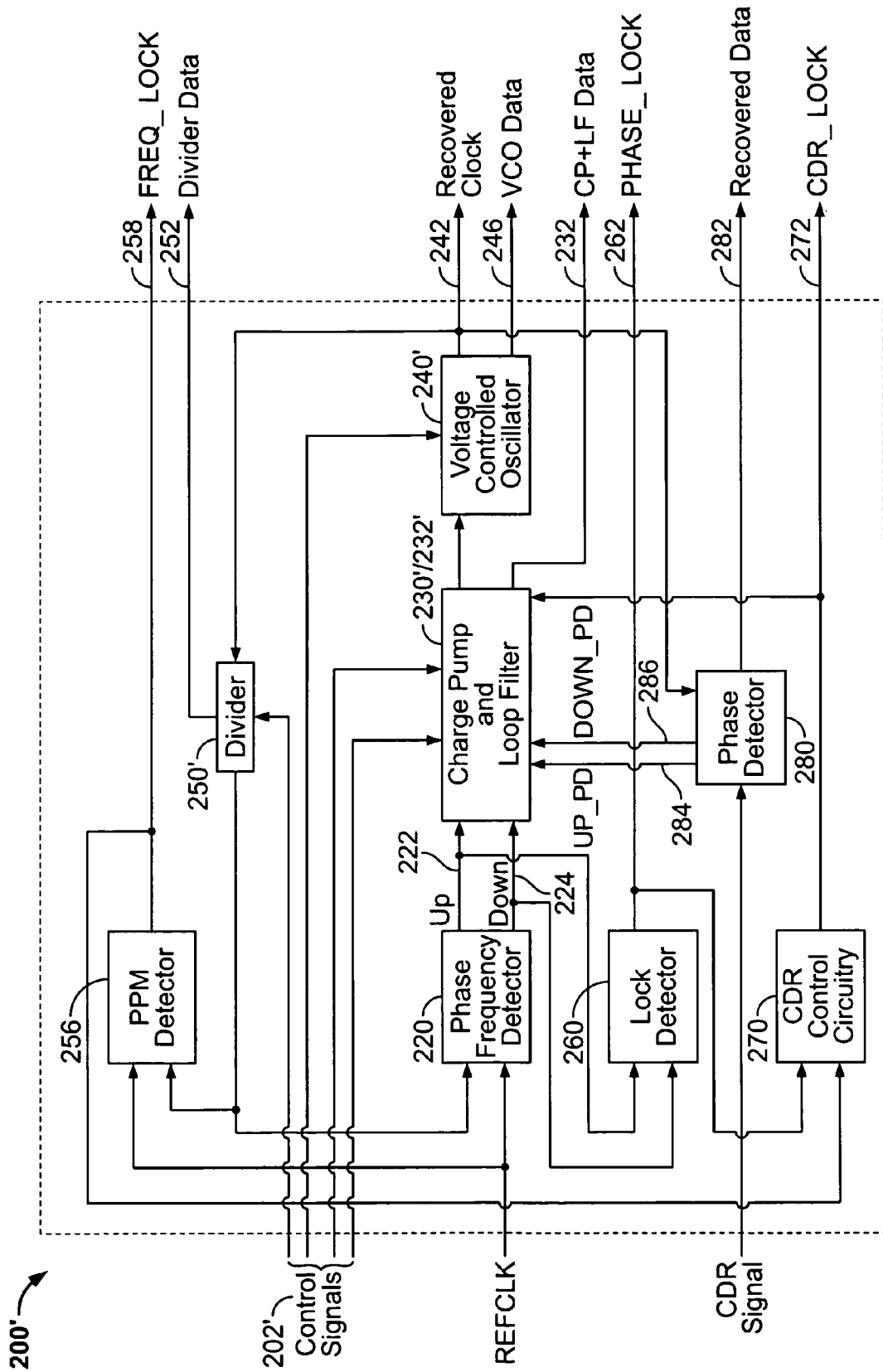

FIGS. 2A–B show illustrative embodiments of CDR receiver circuitry 200. CDR receiver circuitry 200 can be, in one embodiment, CDR circuitry 140 in receiver 130. CDR receiver circuitry 200 includes a phase frequency detector 220 which receives as input a reference clock (REFCLK) signal 204 and an output signal 254 of a divider circuit 250. Phase frequency detector 220 compares the phase and frequency of the two signals it receives and outputs one of two signals, up signal 222 and down signal 224, which are indicative of whether the output signal 254 of divider circuit 250 should be speeded up or slowed down to better match the phase and frequency of REFCLK signal 204. Up signal 222 and down signal 224 are sent as input to a charge pump 230. Charge pump and loop filter 230/232 produces a voltage controlled oscillator (VCO) current control signal used to control VCO 240. Although shown as a single component, charge pump and loop filter 230/232 can be separate components, with the output of charge pump 230 sent as input to loop filter 232, and with the output of loop filter 232 sent as input to VCO 240. VCO 240 outputs a recovered clock signal 242 that better matches REFCLK signal 204 with respect to phase and frequency. The VCO output signal 242 is applied to divider circuit 250 which divides the VCO output signal frequency by a predetermined scale factor W to produce signal 254 which is input to phase frequency detector 220.

REFCLK signal 204 and signal 254 are input to a parts per million (PPM) detector 256 which determines whether signal 254 has a frequency that is similar to the frequency of REFCLK signal 204. PPM detector 256 computes a frequency difference between REFCLK signal 204 and signal 256 and compares the frequency difference to a PPM setting. If the frequency difference is at or less than the current PPM setting, PPM detector 256 outputs a frequency lock (FREQ_LOCK) signal 258 (e.g., sets signal 258 to logic 1).

Up signal 222 and down signal 224 generated from phase frequency detector 220 are also sent as input to a lock detector 260 which determines whether signal 254 has a phase that is similar to the phase of REFCLK signal 204. For example, when up signal 222 and down signal 224 are both logic 0, this may indicate that signal 252 does not have to be speeded up or slowed down. When this occurs, lock detector 260 can output a phase lock (PHASE_LOCK) signal 262 (e.g., sets signal 262 to logic 1).

FREQ_LOCK signal 258 and PHASE_LOCK signal 262 are input to CDR control circuitry 270. Control circuitry 270 directs the processing of data in CDR circuitry 200. Control circuitry 270 determines whether FREQ_LOCK signal 258 and PHASE_LOCK signal 262 both go to logic 1, indicating that recovered clock signal 242 is similar in phase and frequency to REFCLK signal 204. If signals 258 and 262 both go to logic 1, control circuitry 270 sets a CDR_LOCK signal 272 to logic 1 and CDR circuitry 200 switches to data mode. If signals 258 and 262 do not both go to logic 1, control circuitry 270 sets CDR_LOCK signal 272 to logic 0 and CDR circuitry 200 remains in reference clock mode.

CDR_LOCK signal 272 is sent as input to charge pump 230. Charge pump 230 can include circuitry that directs the processing of data in either reference clock mode or data mode based on the logic value of CDR_LOCK signal 272. When CDR_LOCK signal 272 is logic 0, charge pump 230 accepts as input up signal 222 and down signal 224 from phase frequency detector 220 for processing in reference clock mode. When CDR_LOCK signal 272 is logic 1, charge pump 230 accepts as input an up_pd signal 284 and a down_pd signal 286 from a phase detector 280 for processing in data mode.

Phase detector 280 accepts as input CDR signal 206 and recovered clock signal 242. Phase detector 280 compares the phases of recovered clock signal 242 and CDR signal 206 and outputs one of two signals, up_pd signal 284 and down_pd signal 286, which are indicative of whether recovered clock signal 242 needs to be speeded up or slowed down to better match the phase of CDR signal 206. Up_pd signal 284 and down_pd signal 286 are sent as input to charge pump 230 described above. Charge pump and loop filter 230/232 outputs a signal that is sent as input to VCO 240 to produce recovered clock signal 242 whose phase has been adjusted based on up_pd signal 284 and down_pd signal 286. Phase detector 280, using recovered clock signal 242, produces a recovered data signal 282 based on CDR signal 206.

The flow of data during reference clock mode and data mode goes through two different loops in CDR circuitry 200. During reference clock mode, data is processed in the following path: phase frequency detector 220, charge pump and loop filter 230/232, VCO 240, divider 250, and back to phase frequency detector 220 where the path begins again. CDR circuitry 200 continues to process data in this path until PPM detector 256 sets FREQ_LOCK signal 258 to logic 1 and lock detector 260 sets PHASE_LOCK signal 262 to logic 1, or at another suitable time.

During data mode, data is processed in the following path: phase detector 280, charge pump and loop filter 230/232, VCO 240, and back to phase detector 280 where the path begins again. CDR circuitry 200 continues to process data in this path until FREQ_LOCK signal 256 goes to logic 0 or at another suitable time.

CDR circuitry 200 can be designed to have a dynamically adjustable loop bandwidth that does not require the circuitry to be reconfigured in order to reprogram the circuitry with a new bandwidth setting. One CDR circuit can be provided to support multiple systems or protocols, multiple parameter requirements for a given system or protocol, and changes in the input frequency or data rate within a given system or protocol. A user can customize CDR circuitry 200 with programmable logic that determines how the circuitry is to monitor and dynamically control the bandwidth. Providing CDR circuitry 200 with a dynamically adjustable bandwidth allows for the flexibility to change the bandwidth while the circuitry is processing data in response to changing conditions or at any suitable time. For example, the bandwidth of CDR circuitry 200 can be dynamically adjustable based upon a change in the system or protocol requirements or a change in the input frequency or data rate within a given system or protocol.

The bandwidth of CDR circuitry 200 can also be dynamically adjustable based upon the source of dominant noise in the circuitry. If the dominant noise originates from the power source, a larger bandwidth is needed to filter the noise. If the dominant noise originates from the input of the circuitry, a smaller bandwidth is needed to filter the noise.

The bandwidth of CDR circuitry 200 can further be dynamically adjustable to provide flexibility in the speed with which the circuitry can track variations in input frequency and in the speed with which the circuitry can acquire frequency or phase lock (e.g., lock time) of data in the circuitry. During reference clock mode, the lock time measures the time for the phase and frequency of recovered clock signal 242 to align with the phase and frequency of reference clock signal 204. During data mode, the lock time measures the time for the phase of recovered clock signal 242 to align with the phase of CDR data signal 206. The larger the bandwidth, the smaller the lock time. With large bandwidths, CDR circuitry 200 can track variations in input frequency faster and can provide faster response times. The smaller the bandwidth, the larger the lock time. With small bandwidths, CDR circuitry 200 is slower in tracking variations in input frequency and provides slower response times.

Different components (e.g., 230, 232, 240, 250) in CDR circuitry 200 help determine the bandwidth of the system. The components can include charge pump 230, loop filter 232, VCO 240, divider 250, and any other suitable components. The components are arranged in a feedback loop (e.g., the loop used to process data during reference clock mode) where the output data is sent back to the input for further processing.

The setting in charge pump 230 that helps determine the bandwidth is the current. The current can be within a particular range depending on the capacity of CDR circuitry 200. Current that is too low may result in high static phase and a large lock time. Current that is too high may result in a small lock time but may cause CDR circuitry 200 to become unstable.

The settings in loop filter 232 that help determine the bandwidth include a loop resistor, large capacitor, and small capacitor. The resistor, with the current from charge pump 230, helps generate the voltage for VCO 240. To prevent a large bandwidth, the resistor value needs to be optimized with the current from charge pump 230. For example, if the current from charge pump 230 is large, a smaller resistor value is desired. The large capacitor functions as an integrator and averages out the output signal from charge pump 230. The small capacitor filters out the high frequency components of the signal. These settings in loop filter 232 help determine the phase margin and damping factor. The greater the phase margin, the more stable the system. The larger the damping factor, the slower the response time of the circuitry. If the damping factor is too small, the data signal may oscillate, indicating that the circuitry is either continuously over-compensating or under-compensating.

The setting in VCO 240 that helps determine the bandwidth is the voltage gain. A large voltage gain results in high, undesirable jitter. A smaller voltage gain is desirable. The minimum voltage gain is limited by the frequency operating range of VCO 240.

The setting in divider 250 that helps determine the bandwidth is the scale factor (e.g., W) by which recovered clock signal 242 is divided or multiplied to produce output signal 254 in the feedback loop. If the scale factor is too large, this may cause CDR circuitry 200 to become unstable, which may further result in the degradation of the phase margin.

Although the invention is described herein primarily in the context of the bandwidth being determined based on the current of charge pump 230, the resistance, large capacitance and small capacitance (capacitance) of loop filter 232, the voltage gain of VCO 240, and the scale factor of divider 250 for clarity, the bandwidth can be determined by any suitable setting or combination of settings in any suitable component or combination of components.

The settings in each of the different components (e.g., 230, 232, 240, 250) of CDR circuitry 200 can be dynamically adjustable while CDR circuitry 200 is processing data. The bandwidth is directly proportional to the settings of charge pump 230, loop filter 232, and VCO 240, and inversely proportional to the setting of divider 250. For example, the larger (or smaller) the current of charge pump 230, the resistance or capacitance of loop filter 232, or the voltage gain of VCO 240, the larger (or smaller) the bandwidth of CDR circuitry 200. The larger (or smaller) the scale factor of divider 250, the smaller (or larger) the bandwidth of CDR circuitry 200. The bandwidth can be made dynamically adjustable by allowing one or more settings (e.g., current, resistance, capacitance, voltage gain, scale factor) in one or more of the different components (e.g., 230, 232, 240, 250) in CDR circuitry 200 to be changed in response to any suitable condition or at any suitable time in order to produce a bandwidth that meets a given system or protocol, the specific parameter requirements for the given system or protocol, and the input frequency or data rate within a given system or protocol. The specific requirements can be for parameters such as, for example, jitter (e.g., jitter tolerance, jitter transfer, jitter generation), source of dominant noise, lock time, or other suitable parameter or combination of parameters.

Figure 3:
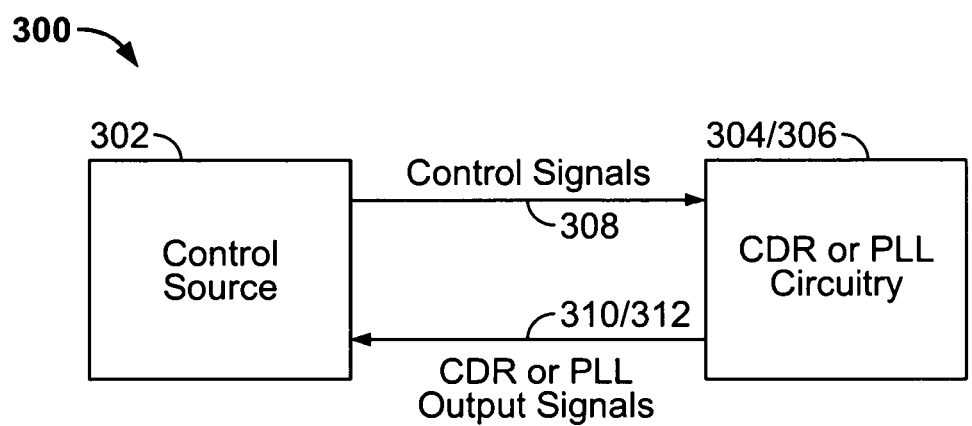
FIG. 3 is a simplified block diagram of an illustrative embodiment of circuitry in accordance with the invention.

Control signals 202 can be used to drive new settings in components in CDR circuitry 200 to provide a dynamically adjustable bandwidth. FIG. 3 illustrates a circuitry 300 having a control source 302 and CDR or PLL circuitry 304/306. CDR circuitry 304 can be circuitry 140 (FIG. 1), circuitry 200 (FIGS. 2A–B), or other suitable circuitry. PLL circuitry 306 can be circuitry 430 (FIG. 4) or other suitable circuitry. Control source 302 can be a PLD, a processor, circuitry external to the PLD, user input, or a combination of the same. For a PLD, processor, or external circuitry, control source 302 can include an algorithm or state machine that can dynamically adjust the bandwidth of CDR or PLL circuitry 304/306 based on predetermined conditions. The algorithm or state machine can be customized to control how CDR or PLL circuitry 304/306 is to monitor and dynamically adjust the bandwidth Control source 302 sends as output control signals 308 to CDR or PLL circuitry 304/306 and receives as input CDR or PLL output signals 310/312 from CDR or PLL circuitry 304/306. Control signals 308 can be control signals 202 (FIGS. 2A–B). Control signals 308 can be used to change the settings (e.g., current, resistance, capacitance, voltage gain, scale factor) in the different components (e.g., charge pump 230, loop filter 232, VCO 240, divider 250) in CDR or PLL circuitry 304/306. Control signals 308 can be set at any suitable time and in response to any suitable condition. Such conditions can include, for example, a change in the system or protocol requirements, a change in the input frequency or data rate within a given system or protocol, the source of dominant noise, the lock time, or other suitable conditions. These conditions can be determined based on CDR or PLL output signals 310/312, which can include charge pump and loop filter (CP+LF) data signal 234/236, recovered clock signal 242, VCO data signal 244, divider data signal 252, FREQ_LOCK signal 258, PHASE_LOCK signal 262, CDR_LOCK signal 272, recovered data signal 282, and any other suitable output signal or combination of output signals from CDR circuitry (FIGS. 2A–B). Signals 234, 236, 244, and 252, which are output from charge pump 230, loop filter 232, VCO 240, and divider 250, respectively, can include input data, output data, the values of any settings, timing information, or any other suitable data. Based on CDR or PLL output signals 310/312, control source 302 can monitor the data to determine whether to dynamically adjust any one or combination of settings in the different components.

Referring back to FIG. 2A, control signals 202 can drive bandwidth control circuitry 290 which generates signals in path 292 to control the settings in the different components of CDR circuitry 200. In one embodiment, control signals 202 can drive logic (e.g., random access memory bits) to control circuitry 290 which can include a lookup table that correlates the logic of control signals 202 to a particular component, a particular setting for a selected component, and a particular value for the selected setting. Depending on the logic of control signals 202, the corresponding data in the lookup table is sent as output over one of paths 292 to a corresponding component 230, 232, 240, or 250. Each component 230, 232, 240, and 250 may have a dedicated lookup table stored in control circuitry 290 for changing the setting of the respective component. Alternatively, one lookup table may be stored in control circuitry 290 that correlates the logic of control signals 202 to values of settings for a combination of components 230, 232, 240, and 250. For a given system or protocol, the settings for the combination of components 230, 232, 240, and 250 in the lookup table are designed to produce a bandwidth that meets the specific requirements for the given system or protocol.

As an illustration, in one embodiment, control signals 202 can include any suitable number of random access memory bits needed to index a number of combinations of values of settings for the different components in the lookup table. For example, if four system or protocol requirements are supported, the control signals can include two bits (e.g., $2^2=4$), whose different logic combinations correspond to a combination of values of settings for the different components for a given system or protocol as shown in the following lookup table:

TABLE 1

| Data Bits | Charge Pump Current | Loop Filter Resistor | Loop Filter Cap. | VCO Voltage Gain | Divider Scale Factor |
|---|---|---|---|---|---|
| 00 | $I_{CP0}$ | $R_0$ | $C_0$ | $VG_0$ | $W_0$ |
| 01 | $I_{CP1}$ | $R_1$ | $C_1$ | $VG_1$ | $W_1$ |
| 10 | $I_{CP2}$ | $R_2$ | $C_2$ | $VG_2$ | $W_2$ |
| 11 | $I_{CP3}$ | $R_3$ | $C_3$ | $VG_3$ | $2_3$ |

The data bits are driven to control circuitry 290 by control signals 202. The combination of setting values include a charge pump current ($I_{CP}$), loop filter resistor (R), loop filter capacitance (C), VCO voltage gain (VG), and divider scale factor (W). The setting values can be driven on one of paths 292 to respective components 230, 232, 240, and 250. Although Table 1 shows settings for charge pump current ($I_{CP}$), loop filter resistor (R), loop filter capacitance (C), VCO voltage gain (VG), and divider scale factor (W), any suitable setting or combination of settings can located in the lookup table. The lookup table can also include combinations of values of settings for the different components based on predetermined conditions such as, for example, the input frequency or data rate within the given system or protocol, the source of dominant noise in the circuitry, the desired speed with which the circuitry can track variations in input frequency, the desired speed with which the circuitry can acquire frequency or phase lock of data in the circuitry, or any other suitable condition.

In another embodiment, rather than providing a lookup table in control circuitry 290 that includes combinations of values of settings for the different components, the lookup table can include combinations of control bits for the settings for the different components. These control bits from the lookup table can be driven on one of paths 292 to respective components 230, 232, 240, and 250. Each component 230, 232, 240, and 250 can include control circuitry having a lookup table that correlates the received control bits to a setting value in a respective component.

As an illustration, in one embodiment, control signals 202 can include two data bits whose different logic combinations correspond to a combination of control bits for settings for the different components for a given system or protocol as shown in the following lookup table:

TABLE 2

| Data Bits | Charge Pump Current | Loop Filter Resistor | Loop Filter Cap. | VCO Voltage Gain | Divider Scale Factor |
|---|---|---|---|---|---|
| 00 | I [0, 0] | R [0, 1] | C [1, 1] | VG [1, 1] | W [0, 0] |
| 01 | I [0, 1] | R [1, 1] | C [0, 0] | VG [1, 1] | W [0, 1] |
| 10 | I [1, 0] | R [0, 0] | C [1, 0] | VG [1, 1] | W [1, 0] |
| 11 | I [1, 1] | R [0, 0] | C [0, 1] | VG [0, 1] | W [1, 1] |

Each setting for each component has two control bits associated with each combination of data bits from control signal 202, although any suitable number of control bits can be used. Each combination of data bits can have different combinations of control bits (e.g., [0,0], [0,1], [1,0], [1,1]) for a given setting or the same combination of control bits. The control bits are driven on one of paths 292 to respective components 230, 232, 240, and 250 where the setting in the respective components are changed based on the corresponding value stored in a lookup table in the respective components as shown in Table 3:

TABLE 3

| Control Bits | Charge Pump Current |
|---|---|
| I [0, 0] | $I_{CP0}$ |
| I [0, 1] | $I_{CP1}$ |
| I [1, 0] | $I_{CP2}$ |
| I [1, 1] | $I_{CP3}$ |

The lookup table in Table 3 can be in charge pump 230. Each combination of control bits correlates to a value for the charge pump current for a given system or protocol. Similar lookup tables can be found in loop filter 232, VCO 240, and divider 250 for changing the loop filter resistor and capacitor, VCO voltage gain, and divider scale factor, respectively.

In yet another embodiment, control signals 202 can include signals that can be used to indicate whether to increase or decrease the values for a selected setting in a selected component by a predetermined amount. For example, a first signal can be used to indicate whether to increment the value of a selected setting by a predetermined amount (e.g., when a first signal is set to logic 1) while a second signal can be used to indicate whether to decrement the value of a selected threshold setting by a predetermined amount (e.g., when a second signal is set to logic 1). The predetermined amount used to increment or decrement the value of the setting can be same or different, and can be fixed or dynamically adjustable. Control signals 202 can drive control circuitry 290 which generates signals in path 292 to control the settings in the different components of CDR circuitry 200 using any other suitable approach or combination of approaches.

Instead of providing one bandwidth control circuit 290 for controlling the settings in components 230, 232, 240, and 250, more than one bandwidth control circuit may be provided. For example, each component 230, 232, 240, and 250 may have dedicated bandwidth control circuitry with dedicated control signals used to dynamically adjust the settings in the respective components. Alternatively, some of components 230, 232, 240, and 250 may share bandwidth control circuitry.

In another embodiment, dedicated control signals 202' can be sent as input directly to respective components 230', 232', 240', and 250' (FIG. 2B). Components 2301, 232', 240', and 250' may each have control circuitry that dynamically adjusts the settings in the respective components using any suitable approach or combination of approaches. Control signals 202' can include, for example, new values for the settings of the different components, data bits that correspond to new values stored in a lookup table in each of the different components, or signals indicating whether the settings for the different components should be incremented or decremented by a predetermined amount.

Although not shown in FIGS. 2A–B, CDR circuitry 200 can include other suitable circuitry and signals. CDR circuitry 200 can include, for example, control signals to direct the reset of some or all the circuitry, control signals to set circuitry to different values, and additional output signals that allow a PLD, a processor, circuitry external to a PLD, or a user to monitor the outputs during the different modes of data processing.

Figure 4:
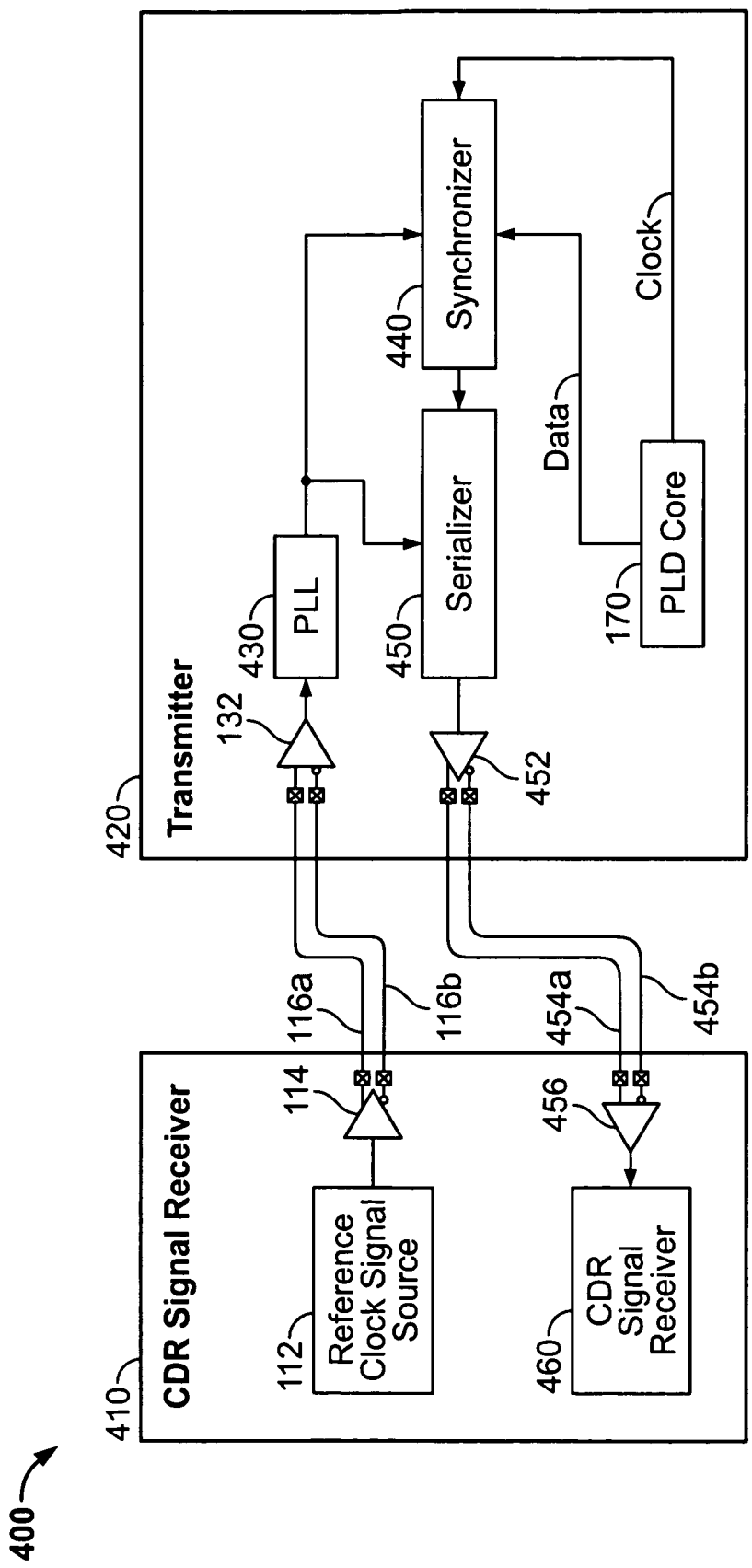
FIG. 4 is a simplified schematic block diagram of an illustrative embodiment of CDR signaling apparatus in accordance with the invention.
Figure 5:
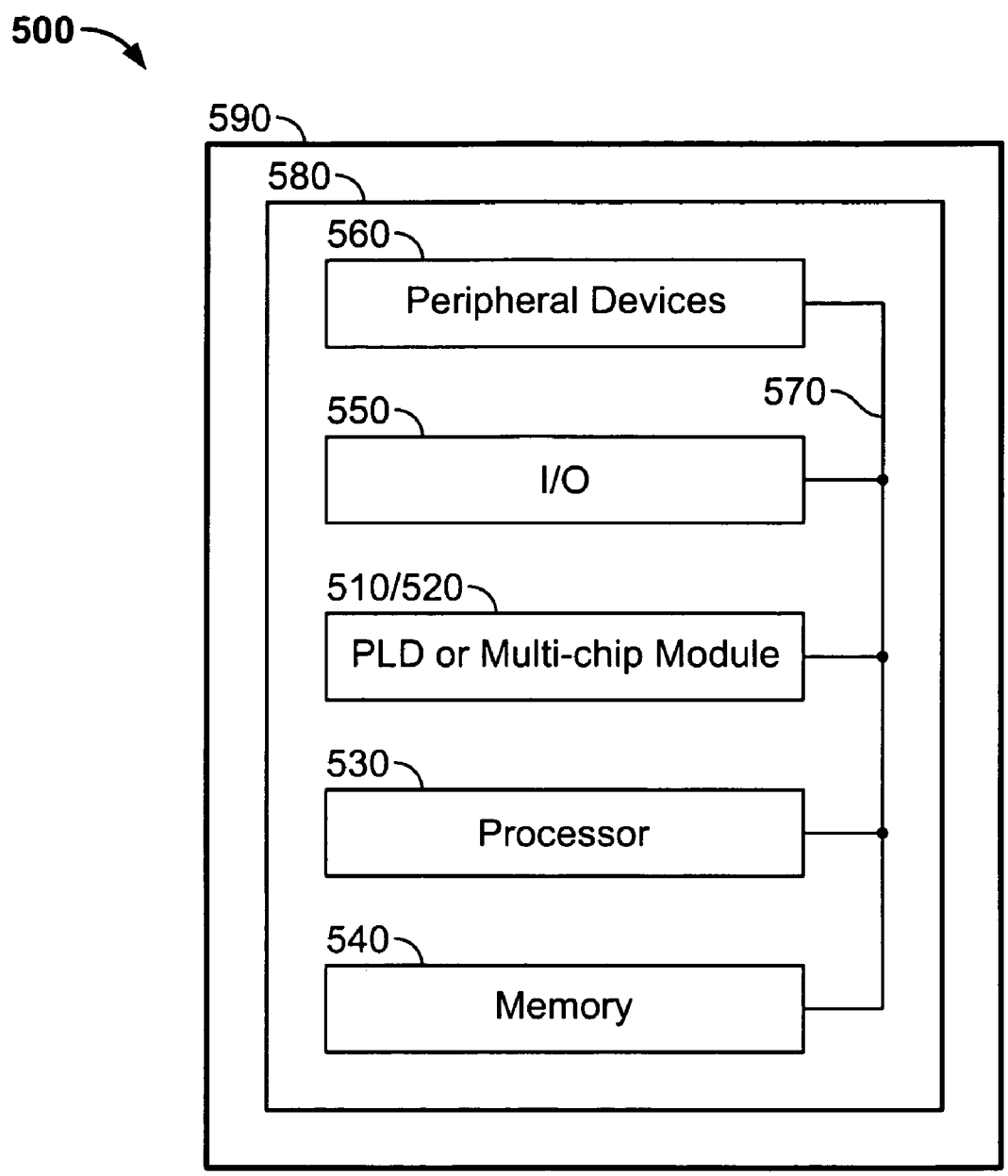
FIG. 5 is a simplified block diagram of an illustrative system employing circuitry in accordance with the invention.

FIG. 4 shows an illustrative embodiment of CDR signaling apparatus 400. Once again, although the major components 410 and 420 could be provided on the same integrated circuit, they are more typically portions of separate integrated circuits or circuit assemblies. In FIG. 5, for example, component 420 could be associated with elements 510/520, while component 510 could be associated with any other element(s) 530, 540, 550, and/or 560.

In apparatus 100, PLD core 170 is associated with the receiver 130 of the CDR signal. In apparatus 400, PLD core 170 is associated with the transmitter 420 of the CDR signal. Once again, to facilitate providing a programmable, PLD-based transmitter which can communicate with CDR receivers 130 having a wide range of expectations regarding the frequency of the CDR clock signal, apparatus 400 includes a reference clock signal source 112 in receiver 410. Elements 112, 114, 116, and 132 may all be similar to the corresponding numbered elements in FIG. 1. The reference clock signal is transmitted to transmitter 420 as described above in connection with FIG. 1. A PLL 430 in transmitter 420 processes this signal to produce an output signal having a frequency which is precisely equal to the desired CDR clock frequency. PLL 430 can include some of the same components as in CDR circuitry 200 in FIGS. 2A–B. For example, PLL 430 can include the components used to process data in the first data loop during reference clock mode, namely phase frequency detector 220, charge pump and loop filter 230/232, VCO 240, and divider 250. These components, as in CDR circuitry 200, help determine the bandwidth of PLL 430. As described in connection with FIGS. 2A–B and 3, the bandwidth of PLL 430 can also be dynamically adjustable (the description of CDR circuitry 200 and circuitry 300 with a dynamically adjustable bandwidth applies equally as well to PLL circuitry 430 having a dynamically adjustable bandwidth). Although PLL 430 is described herein primarily in the context of being in CDR signaling apparatus 400, the PLL circuitry can be independent from the CDR signaling apparatus and can have a dynamically adjustable bandwidth.

The CDR clock signal produced by PLL 430 (or some multiple of that signal) is applied to synchronizer 440 and serializer 450. Synchronizer 440 also receives data and clock signals from PLD core 170. Synchronizer 440 uses the signals it receives to output the data from core 170 in synchronism with the CDR clock signal. Serializer 450 converts typically parallel data from synchronizer 440 to typically serial CDR data. The serial CDR data output by serializer 450 is transmitted to CDR signal receiver 460 via conventional differential driver 452, leads 454a and 454b, and conventional differential driver 456. (Elements 452, 454, and 456 may be respectively similar to elements 114, 116, and 132 in FIG. 1. Also as in FIG. 1 the use of differential signaling for the CDR data is optional.) Conventional CDR signal receiver 460 uses the clock information embedded in the received CDR signal to extract the data from that signal in the conventional way.

FIG. 5 illustrates a PLD 510 or multi-chip module 520 of this invention in a data processing system 500. Data processing system 500 may include one or more of the following components: a processor 530; memory 540; I/O circuitry 550; and peripheral devices 560. These components are coupled together by a system bus or other interconnections 570 and are populated on a circuit board 580 which is contained in an end-user system 590. Any of the interconnections between element 510/520 and any other elements may be made using the above-described CDR signaling.

System 500 can be used in a wide variety of applications, such as computer networking, data networking, instrumentation, video processing, digital signal processing, or any other application where the advantage of using programmable or reprogrammable logic is desirable. PLD/module 510/520 can be used to perform a variety of different logic functions. For example, PLD/module 510/520 can be configured as a processor or controller that works in cooperation with processor 530. PLD/module 510/520 may also be used as an arbiter for arbitrating access to a shared resource in system 500. In yet another example, PLD/module 510/520 can be configured as an interface between processor 530 and one of the other components in system 500. It should be noted that system 500 is only exemplary, and that the true scope and spirit of the invention should be indicated by the following claims.

Various technologies can be used to implement PLDs 510 or multi-chip modules 520 having the features of this invention, as well as the various components of those devices (e.g., the above-described PLCs and programmable function control elements ("FCEs") that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. PLCs and other circuit components can be controlled by various, programmable, function control elements ("FCEs"). (With certain implementations (e.g., fuses and metal optional links) separate FCE devices are not required.) FCEs can also be implemented in any of several different ways. For example, FCEs can be SRAMs, DRAMs, magnetic RAMs, ferro-electric RAMs, first-in first-out ("FIFO") memories, EPROMs, EEPROMs, function control registers, ferro-electric memories, fuses, antifuses, or the like. From the various examples mentioned above it will be seen that this invention is applicable to both one-time-only programmable and reprogrammable devices.

Thus it is seen that CDR circuitry and PLL circuitry are provided with dynamically adjustable bandwidths. One skilled in the art will appreciate that the invention can be practiced by other than the prescribed embodiments, which are presented for purposes of illustration and not of limitation, and the invention is limited only by the claims which follow.

What is claimed is:

1. Circuitry operative in two modes for providing a dynamically adjustable bandwidth comprising:
   a phase frequency detector receiving as input a clock signal and having a signal output;
   a phase detector receiving as input a clock data recovery (CDR) signal and having a signal output;
   a charge pump having a pump input coupled to the signal output of the phase frequency detector during a first of the two modes, and coupled to the signal output of the phase detector during a second of the two modes, and having a pump output;
   a loop filter having a filter input coupled to the pump output of the charge pump and having a filter output;
   a voltage controlled oscillator having an oscillator input coupled to the filter output of the loop filter and having an oscillator output;
   a divider circuit having a divider input coupled to the oscillator output of the voltage controlled oscillator and having a divider output that feeds back to the input of the phase frequency detector; and
   control circuitry that receives as input at least one control signal and is operative to dynamically adjust a setting in at least one of the charge pump, the loop filter, the voltage controlled oscillator, and the divider circuit while the circuitry is processing data.

2. The circuitry of claim 1 wherein the circuitry operates as a clock data recovery circuitry during the first mode and as a phase locked loop circuitry in the second mode.

3. The circuitry of claim 1 wherein the setting in the charge pump that can be dynamically adjusted is current.

4. The circuitry of claim 1 wherein the setting in the loop filter that can be dynamically adjusted is at least one of a resistor value and a capacitor value.

5. The circuitry of claim 1 wherein the setting in the voltage controlled oscillator that can be dynamically adjusted is a voltage gain.

6. The circuitry of claim 1 wherein the setting in the divider circuit that can be dynamically adjusted is a scale factor.

7. The circuitry of claim 1 wherein the at least one control signal includes a value for the setting.

8. The circuitry of claim 1 wherein the at least one control signal is indicative of whether a value of the setting is to be increased or decreased.

9. The circuitry of claim 1 wherein the at least one control signal includes at least one data bit that corresponds to information on a value for the setting stored in a lookup table in the control circuitry.

10. The circuitry of claim 1 wherein the at least one control signal is set by a programmable logic device.

11. The circuitry of claim 1 wherein the at least one control signal is set by circuitry external to a programmable logic device.

12. The circuitry of claim 1 wherein the at least one control signal is set by user input.

13. A digital processing system comprising:
   processing circuitry;
   a memory coupled to the processing circuitry; and
   circuitry as defined in claim 1 coupled to the processing circuitry and the memory.

14. A printed circuit board on which is mounted the apparatus as defined in claim 1.

15. The printed circuit board defined in claim 14 further comprising:
   a memory mounted on the printed circuit board and coupled to the circuitry.

16. The printed circuit board defined in claim 14 further comprising:
   processing circuitry mounted on the printed circuit board and coupled to the apparatus.

17. The circuitry of claim 1 further comprising:
   CDR control circuitry operative to provide a control signal to the charge pump, wherein the control signal is operative to select between the first and second modes.

18. The circuitry of claim 17 wherein the control signal selects the first mode in response to an indication that the clock signal has a phase and frequency which respectively corresponds to a phase and frequency of the oscillator output.

19. A programmable logic device comprising:
   clock data recovery (CDR) circuitry selectively operative in two modes that receives as input a reference clock signal and a CDR signal and in a first selected mode of the two modes is operative to produce a recovered clock signal having a phase and frequency which respectively corresponds to a phase and frequency of the reference clock signal, and in a second selected mode of the two modes is operative to use the recovered clock signal to recover clock information and data information from the CDR signal; and
   control circuitry that receives as input at least one control signal and is operative to dynamically adjust a bandwidth of the CDR circuitry by changing a setting in at least one component in the CDR circuitry while the CDR circuitry is processing data, wherein the control circuitry is capable of changing the setting in a charge pump, a loop filter, a voltage controlled oscillator, and a divider circuit in the CDR circuitry.

20. The programmable logic device of claim 19 wherein the CDR circuitry comprises:
   a phase frequency detector receiving as input the reference clock signal and having a signal output;
   a phase detector receiving as input a CDR signal and having a signal output;
   the charge pump having a pump input coupled to the signal output of the phase frequency detector during the first mode, and coupled to the signal output of the phase detector during the second mode, and having a pump output;
   the loop filter having a filter input coupled to the pump output of the charge pump and having a filter output;
   the voltage controlled oscillator having an oscillator input coupled to the filter output of the loop filter and having an oscillator output; and
   the divider circuit having a divider input coupled to the oscillator output of the voltage controlled oscillator and having a divider output that feeds back to the input of the phase frequency detector.

21. The programmable logic device of claim 20 wherein the setting in the at least one component comprises current in the charge pump.

22. The programmable logic device of claim 20 wherein the setting in the at least one component comprises a resistor value in the loop filter.

23. The programmable logic device of claim 20 wherein the setting in the at least one component comprises a capacitor value in the loop filter.

24. The programmable logic device of claim 20 wherein the setting in the at least one component comprises a voltage gain in the voltage controlled oscillator.

25. The programmable logic device of claim 20 wherein the setting in the at least one component comprises a scale factor in the divider circuit.

26. The circuitry of claim 20 further comprising:
   CDR control circuitry operative to provide a control signal to the charge pump, wherein the control signal is operative to select between the first and second modes.

27. The circuitry of claim 26 wherein the control signal selects the first mode in response to an indication that the clock signal has a phase and frequency which respectively corresponds to a phase and frequency of the oscillator output.

28. The programmable logic device of claim 19 wherein the at least one control signal is set by the programmable logic device.

29. The programmable logic device of claim 19 wherein the at least one control signal is set by circuitry external to the programmable logic device.

30. The programmable logic device of claim 19 wherein the at least one control signal is set by user input.

31. A programmable logic device comprising:
   phase locked loop (PLL) circuitry selectively operative in two modes that receives as input a clock signal and in a first selected mode of the two modes is operative to produce a recovered clock signal having a phase and frequency which respectively corresponds to a phase and frequency of the clock signal, and in a second selected mode of the two modes is operative to drive another component external to the PLL circuitry in the programmable logic device with the recovered clock signal; and
   control circuitry that receives as input at least one control signal and is operative to dynamically adjust a bandwidth of the PLL circuitry by changing a setting in at least one component in the PLL circuitry while the PLL circuitry is processing data, wherein the control circuitry is capable of changing the setting in a charge pump, a loop filter, a voltage controlled oscillator, and a divider circuit in the PLL circuitry.

32. The programmable logic device of claim 31 wherein the PLL circuitry comprises:
   a phase frequency detector receiving as input the reference clock signal and having a signal output;
   a phase detector receiving as input a clock data recovery (CDR) signal and having a signal output;
   the charge pump having a pump input coupled to the signal output of the phase frequency detector during the first mode, and coupled to the signal output of the phase detector during the second mode, and having a pump output;
   the loop filter having a filter input coupled to the pump output of the charge pump and having a filter output;
   the voltage controlled oscillator having an oscillator input coupled to the filter output of the loop filter and having an oscillator output; and the divider circuit having a divider input coupled to the oscillator output of the voltage controlled oscillator and having a divider output that feeds back to the input of the phase frequency detector.

33. The programmable logic device of claim 32 wherein the setting in the at least one component comprises current in the charge pump.

34. The programmable logic device of claim 32 wherein the setting in the at least one component comprises a resistor value in the loop filter.

35. The programmable logic device of claim 32 wherein the setting in the at least one component comprises a capacitor value in the loop filter.

36. The programmable logic device of claim 32 wherein the setting in the at least one component comprises a voltage gain in the voltage controlled oscillator.

37. The programmable logic device of claim 32 wherein the setting in the at least one component comprises a scale factor in the divider circuit.

38. The circuitry of claim 32 further comprising:
CDR control circuitry operative to provide a control signal to the charge pump, wherein the control signal is operative to select between the first and second modes.

39. The circuitry of claim 38 wherein the control signal selects the first mode in response to an indication that the clock signal has a phase and frequency which respectively corresponds to a phase and frequency of the oscillator output.

40. The programmable logic device of claim 31 wherein the at least one control signal is set by the programmable logic device.

41. The programmable logic device of claim 31 wherein the at least one control signal is set by circuitry external to the programmable logic device.

42. The programmable logic device of claim 31 wherein the at least one control signal is set by user input.

43. The programmable logic device of claim 31 wherein the external component in the programmable logic device comprises CDR circuitry.

* * * * *